(12) United States Patent
Arnold et al.

(10) Patent No.: US 9,299,858 B2
(45) Date of Patent: Mar. 29, 2016

(54) CAPACITOR INCLUDING A CAPACITOR PLATE FORMED FROM A DOPED SEMICONDUCTOR

(75) Inventors: Ronald Arnold, Milton Keynes (GB); Jason McMonagle, Darlington (GB)

(73) Assignee: RFMD (UK) Limited, Newton Aycliffe (GB)

( * ) Notice: Subject to any disclaimer, the term of this patent is extended or adjusted under 35 U.S.C. 154(b) by 1771 days.

(21) Appl. No.: 11/936,645

(22) Filed: Nov. 7, 2007

(65) Prior Publication Data

US 2008/0106851 A1    May 8, 2008

(30) Foreign Application Priority Data

Nov. 7, 2006    (GB) .................................. 0622104.8

(51) Int. Cl.
*H01L 21/02*    (2006.01)
*H01L 29/94*    (2006.01)
*H01L 27/08*    (2006.01)

(52) U.S. Cl.
CPC ............ *H01L 29/94* (2013.01); *H01L 27/0805* (2013.01)

(58) Field of Classification Search
CPC .......................... H01L 29/94; H01L 27/0805
USPC ............ 257/532, E29.345, E21.396; 438/394
See application file for complete search history.

(56) References Cited

U.S. PATENT DOCUMENTS

| | | | |
|---|---|---|---|
| 4,167,018 A * | 9/1979 | Ohba et al. ................... 257/296 |
| 4,745,446 A * | 5/1988 | Cheng et al. .................. 257/272 |
| 5,083,184 A * | 1/1992 | Eguchi ......................... 257/532 |
| 5,341,009 A | 8/1994 | Young et al. | |
| 5,565,699 A * | 10/1996 | Kaneko et al. ................ 257/379 |
| 5,621,227 A * | 4/1997 | Joshi ............................ 257/184 |
| 6,066,537 A * | 5/2000 | Poh ..................... H01L 23/5223 |
| | | | 257/E21.008 |
| 6,340,832 B2 * | 1/2002 | Kasahara ..................... 257/532 |
| 6,420,747 B2 * | 7/2002 | Coolbaugh et al. .......... 257/296 |
| 6,432,472 B1 | 8/2002 | Farrell et al. | |
| 6,815,798 B2 | 11/2004 | Aiello et al. | |
| 6,858,513 B2 * | 2/2005 | Fujisawa ...................... 438/394 |
| 6,891,711 B1 | 5/2005 | Kurtz | |
| 2004/0209423 A1 | 10/2004 | Tian et al. | |
| 2006/0244061 A1 | 11/2006 | Nowak et al. | |
| 2008/0048216 A1 * | 2/2008 | Ye et al. ....................... 257/288 |

FOREIGN PATENT DOCUMENTS

| | | |
|---|---|---|
| EP | 0259629 | 8/1987 |
| FR | 2644621 | 3/1989 |
| FR | 2644621 B1 | 1/1994 |
| JP | 7147215 A | 6/1995 |

OTHER PUBLICATIONS

Search Report for Application No. GB0622104.8; dated Feb. 11, 2008.

* cited by examiner

*Primary Examiner* — Jesse Y Miyoshi
(74) *Attorney, Agent, or Firm* — Withrow & Terranova, P.L.L.C.

(57) ABSTRACT

A capacitor comprising:
a metal plate
a doped semiconductor plate; and
a dielectric sandwiched therebetween.

33 Claims, 6 Drawing Sheets

CAPACITOR INCLUDING A CAPACITOR PLATE FORMED FROM A DOPED SEMICONDUCTOR

The subject patent application claims priority to and all the benefits of United Kingdom Patent Application No. 0622104.8, which was filed on Nov. 7, 2006 with The UK Patent Office.

The present invention relates to a capacitor, and a method of manufacture of a capacitor. More preferably, the present invention relates to a capacitor comprising a metal plate, a doped semiconductor plate and a dielectric sandwiched therebetween.

It is known to manufacture capacitors on semiconductor substrates as components in integrated circuits. Such capacitors are manufactured by laying down a first metal capacitor plate layer on the substrate. A dielectric layer is deposited on the first metal plate layer. A second metal plate layer is then deposited on the dielectric. Metal layers are expensive. Such a procedure is also time consuming requiring at least three sequential steps.

Accordingly, in a first aspect, the present invention provides a capacitor comprising:
a metal plate
a doped semiconductor plate; and
a dielectric sandwiched therebetween.

The capacitor according to the invention has a number of advantages over such known capacitors. Only one metal plate layer is used, reducing manufacturing cost. In addition the manufacture of other components in the same substrate as the capacitor such as FETs and HBTs requires the production of a highly doped layer in the substrate. The doped semiconductor capacitor plate for the capacitor according to the invention can be produced in the same step further reducing manufacturing costs.

Preferably, the capacitor comprises a metallic contact to the doped semiconductor plate.

Preferably the metallic contact extends around at least 5% of the periphery of the semiconductor plate, preferably around at least 40% of the semiconductor plate, more preferably at least 80% of the semiconductor plate.

The metallic contact can extend completely around the edge of the semiconductor plate.

The doped semiconductor plate can comprise a tongue which protrudes from beneath the metallic plate for connection to the metallic contact.

Preferably, the doped semiconductor plate is a III-V semiconductor plate.

Preferably, the doped semiconductor plate is $In_xGa_{1-x}As$, wherein X is in the range 0 to 0.7, preferably 0 to 0.6, more preferably 0.1 to 0.6, more preferably 0.3 to 0.6, more preferably 0.4 to 0.5.

Preferably, the dopant is Silicon.

Alternatively, the dopant can be at least one of Boron or Carbon.

The dopant concentration can be greater than $1\times10^{17}$ atoms/cm$^3$, preferably greater than $5\times10^{17}$ atoms/cm$^3$, more preferably greater than $1\times10^{18}$ atoms/cm$^3$, more preferably greater than $2\times10^{18}$ atoms/cm$^3$.

The doped semiconductor plate can be a portion of larger semiconductor substrate.

The doped semiconductor plate can be provided by diffusion of the dopant into the semiconductor substrate.

Alternatively, the doped semiconductor plate can be provided by implantation of the dopant into the semiconductor substrate.

Alternatively, the doped semiconductor plate is deposited as a doped layer on a semiconductor substrate, preferably by epitaxial growth.

Preferably, the dielectric comprises Silicon and Nitrogen, the ratio of Silicon and Nitrogen preferably being in the range 0.5 to 2, more preferably in the range 0.65 to 0.85.

Alternatively, the dielectric comprises silicon and oxygen preferably in the ratio 0.5 to 3.

The dielectric layer can further comprise hydrogen contaminant.

Preferably, the dielectric layer is deposited on the doped semiconductor plate by vapour deposition.

The dielectric can be a polymer, preferably BCB or polyamide.

The metal plate of the capacitor can be a bond pad.

In a further aspect of the invention there is provided a method of manufacture of a capacitor comprising the steps of:
providing a doped semiconductor capacitor plate;
providing a dielectric layer on the doped semiconductor capacitor plate; and,
providing a further capacitor plate comprising a metal layer on the dielectric layer.

Preferably, the doped semiconductor plate is provided by diffusing dopant into a portion of a semiconductor substrate.

Alternatively, the doped semiconductor plate is provided by implantation of a portion of a semiconductor substrate with dopant.

Alternatively, the doped semiconductor capacitor plate is provided by depositing a doped semiconductor layer on a semiconductor substrate preferably by epitaxial growth.

Preferably, the dielectric layer is deposited by vapour deposition.

The present invention will now be described by way of example only and not in any limitative sense with reference to the accompanying drawings in which FIG. 1 shows a capacitor according to the invention in cross section;

Figure 1:
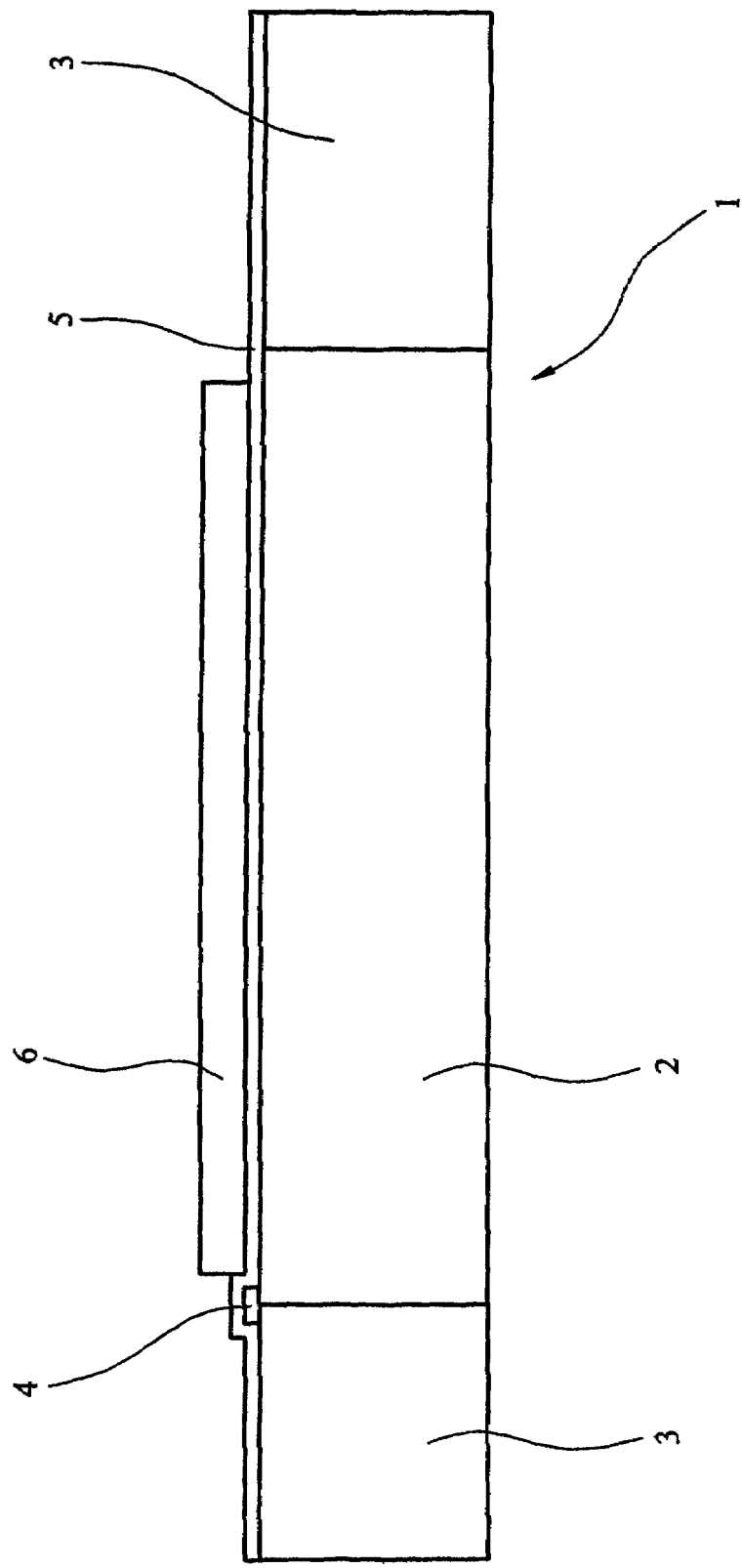

Shown in FIG. 1 is a capacitor 1 according to the invention. The capacitor 1 comprises a first doped semiconductor plate 2. This is manufactured by providing a semiconductor substrate 3 and doping an area of the substrate 3 to form the doped plate 2. In this embodiment the substrate 3 is $In_xGa_{1-x}As$, with x=0.45 although in other embodiments other concentrations of In are possible. The concentration of In is as high as can be tolerated before lattice strain becomes an issue. Lattice strain can cause unacceptable surface roughness which results in capacitor performance reliability issues. InGaAs has a higher mobility than GaAs and hence lower resistance. Useful In concentrations in GaAs are of the order 10-50% with concentrations near the higher end of the range being preferred. In this embodiment the dopant is Silicon. Alternative dopants can be Boron or Carbon. Typically dopant levels are greater than $1\times10^{18}$ cm$^{-3}$ although dopant levels as low as $1\times10^{17}$ cm$^{-3}$ are possible.

A number of doping methods are possible. The dopant can be diffused into an area of the semiconductor substrate 3 to form the doped semiconductor plate 2. Alternatively, the dopant can be introduced by implantation. In a further embodiment (not shown) the doped semiconductor plate 2 is grown on the semiconductor substrate 3, preferably by epitaxial growth.

Connected to the doped semiconductor capacitor plate 2 is an ohmic metal contact 4. Deposited on the doped semiconductor plate 2 and the ohmic metal contact 4 is a dielectric layer 5. The dielectric layer 5 is typically deposited by vapour deposition. In this embodiment the dielectric layer 5 essentially comprises silicon and nitrogen. The vapour deposition process can introduce some variability in the ratio of silicon to nitrogen although this typically lies in the range 0.5 to 2. A silicon to nitrogen ratio as close to the stoichiometric ratio 3:4 as possible is preferred. The vapour deposition process can introduce impurities such as hydrogen into the dielectric layer 5.

In an alternative embodiment the dielectric layer 5 comprises silicon and oxygen, again deposited by vapour deposition process. The vapour deposition process produces a dielectric layer 5 with the silicon to oxygen ratio in the range 0.5 to 3. Again a stoichiometric ratio is to be preferred. Again, impurities such as hydrogen or nitrogen can be introduced by the vapour deposition process.

In an alternative embodiment of the invention the dielectric layer 5 is a polymer such as BCB or polyamide.

Deposited on the dielectric layer 5 is a metal plate 6. In this embodiment the ohmic metal plate 6 is the same material as the ohmic metal contact 4.

Figure 2:
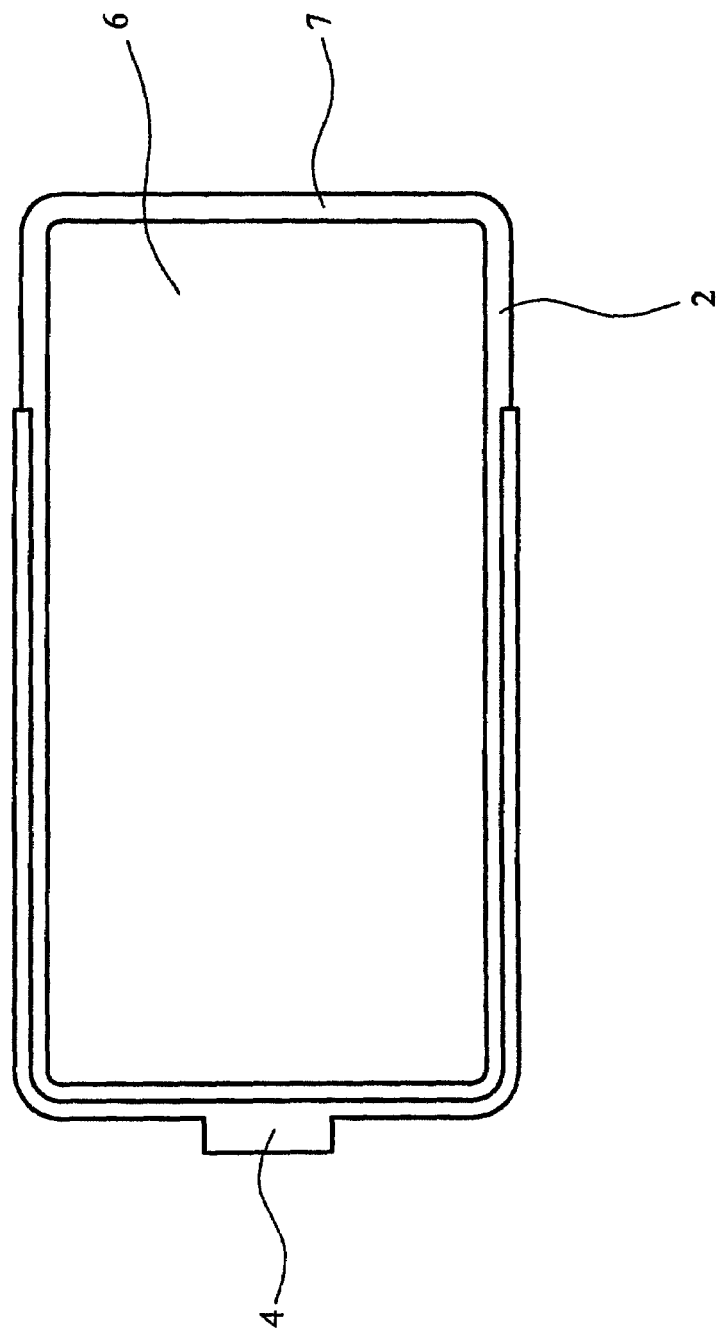
FIG. 2 shows the capacitor of FIG. 1 in plan view.
Figure 3:
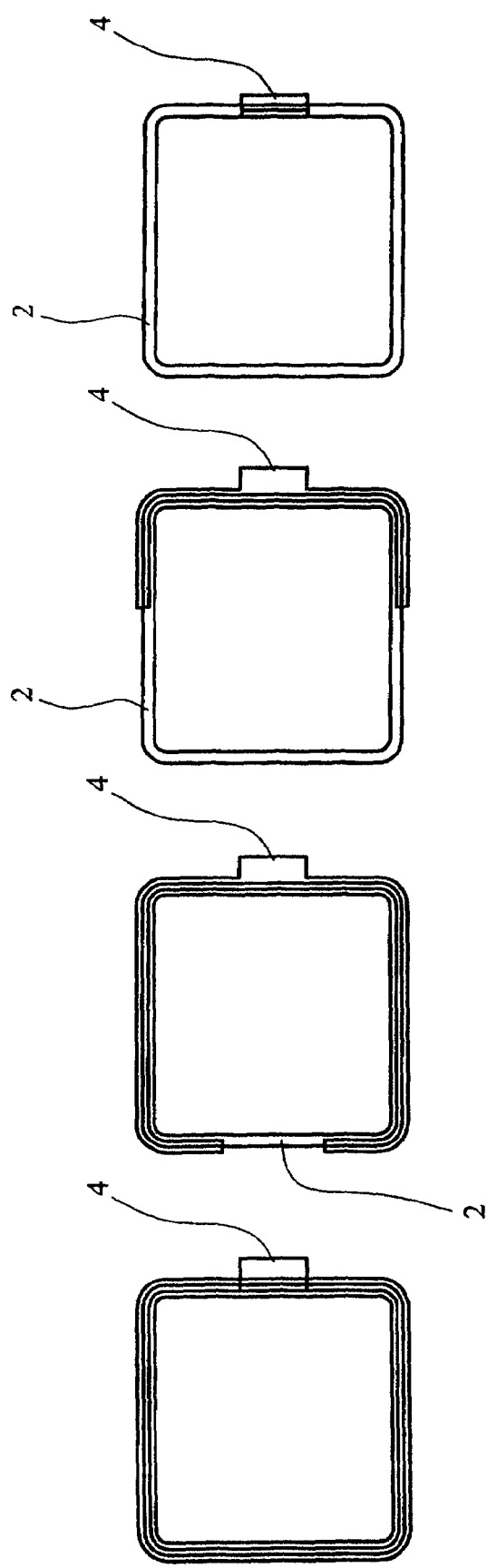
FIGS. 3A-3D show further embodiments of capacitors according to the invention in plan view.

FIG. 2 shows the capacitor 1 of FIG. 1 in plan view. As can be seen the doped semiconductor plate 2 extends from beneath the ohmic metal plate 6 to form a tongue 7 to which the ohmic metal contact 4 is connected. In this embodiment the ohmic metal contact 4 extends partially around the edge of the semiconductor plate 2.

Shown in FIGS. 3A-3D are further embodiments of capacitors 1 according to the invention. In each embodiment the ohmic metal contact 4 extends around the doped semiconductor plate 2. In the first embodiment of FIG. 3A the ohmic metal plate contact 4 only contacts a small portion of the periphery of the semiconductor plate 2. In the final embodiment of FIG. 3D the ohmic metal contact 4 is in contact with the semiconductor plate 2 completely around its periphery. The contact resistivity of the ohmic metal contact 4 to the doped semiconductor plate 2 of the capacitor 1 should be as low as possible. Typical values are <0.2 $\Omega mm^{-1}$ and/or less than $1 \times 10^{-6}$ $\Omega cm^2$.

Figure 4:
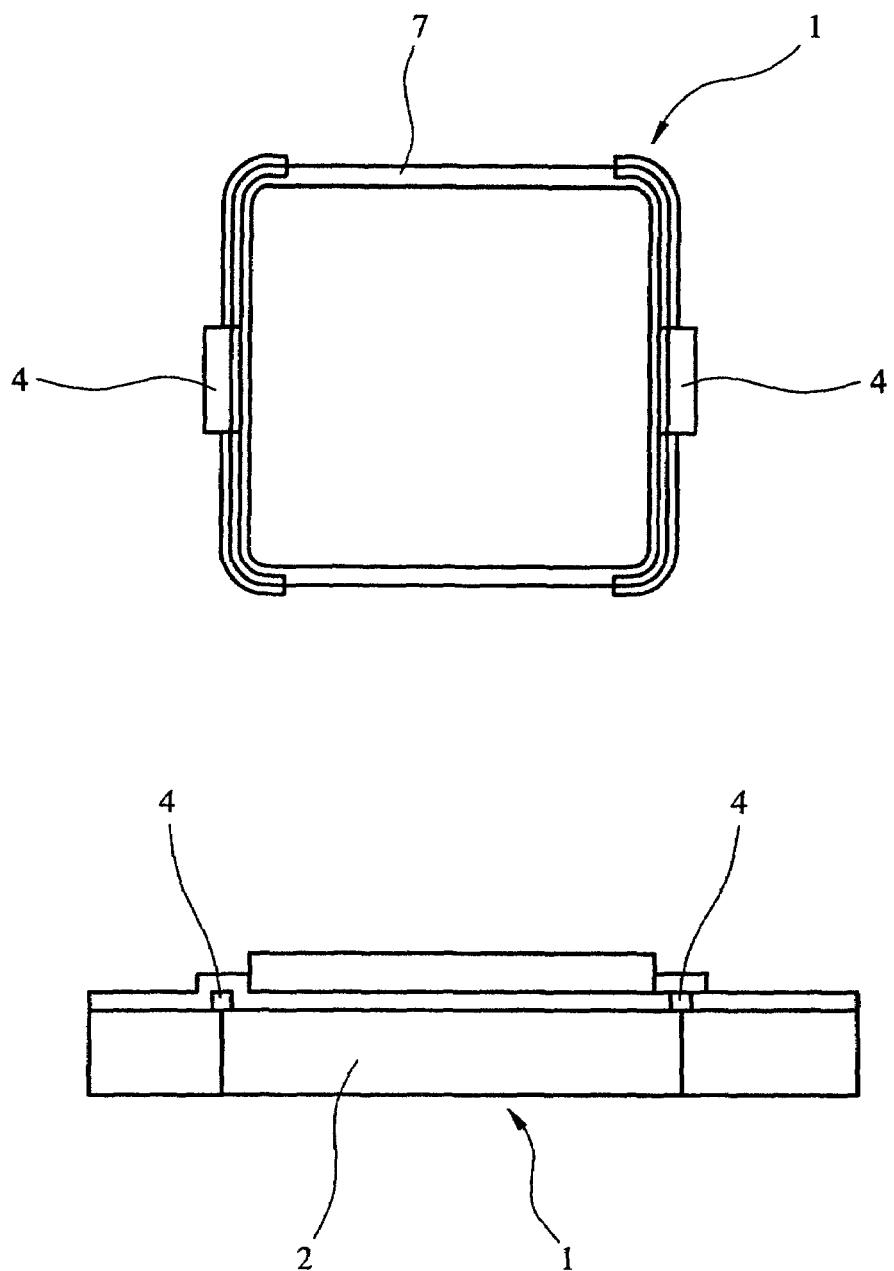
FIGS. 4A-4B show a further embodiment of a capacitor according to the invention in cross sectional and plan views.

Shown in FIGS. 4A-4B is a further embodiment of the invention in cross sectional and plan view. This embodiment differs from those of FIGS. 3A-3D in that there are two ohmic metal contacts 4 connected to different portions of the tongue 7 of the doped semiconductor capacitor plate 2.

Shown in FIGS. 5A-5B is a further embodiment of a capacitor 1 according to the invention in cross sectional and plan view. In this embodiment a portion 8 of the tongue 7 extends away from the upper metal plate 6. The ohmic metal contact 4 is connected to this portion 8 remote from the metal plate 6 as shown.

Figure 6:
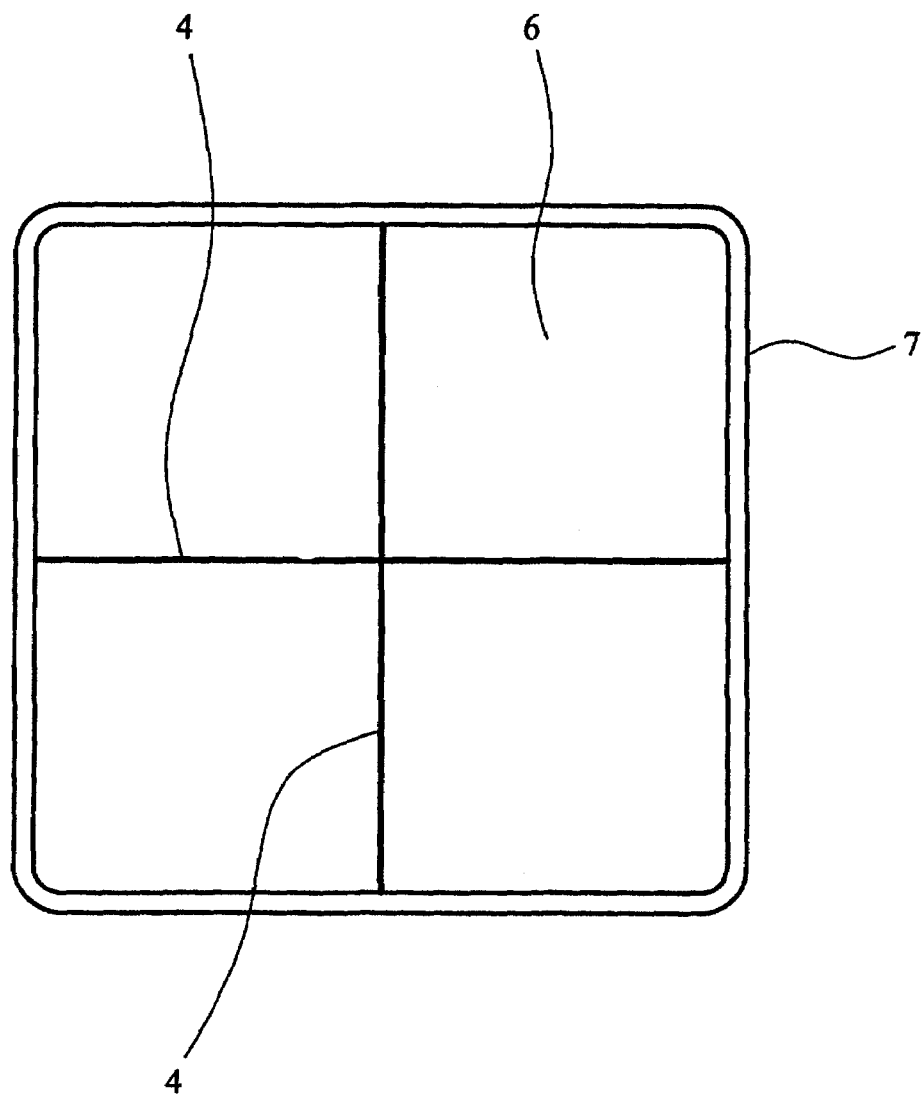

Shown in FIG. 6 is a further embodiment of a capacitor 1 according to the invention. In this embodiment the ohmic metal contact 4 is laid down not only around the edge of the doped semiconductor plate 2 but also across the plate 2 so dividing the plate 2 into segments as shown. This reduces the series resistance for the capacitor 1.

Figure 5:
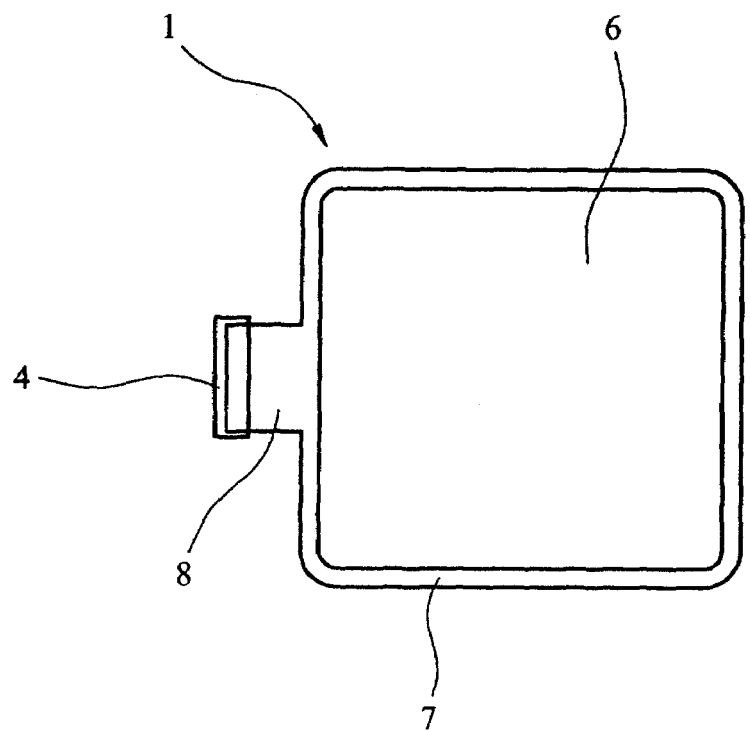
FIGS. 5A-5B show a further embodiment of the invention in cross sectional and plan views; and, FIG. 6 shows a further embodiment of a capacitor according to the invention.
Figure 5:
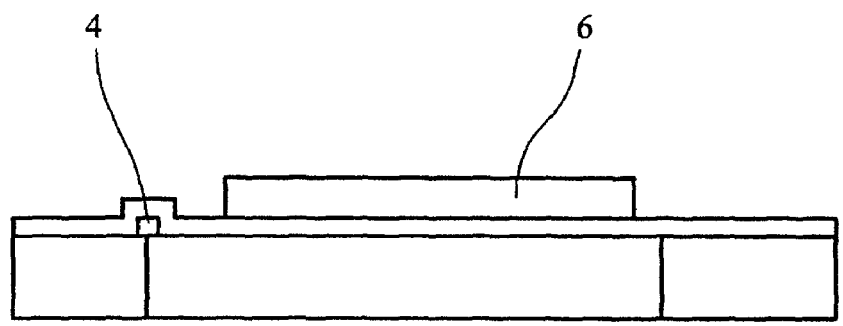

It is possible to adjust the resistance loss of the capacitor 1 according to the invention in a number of ways. One can adjust the semiconductor doping level for the semiconductor capacitor plate 2. Alternatively/additionally one can adjust the aspect ratio of the semiconductor capacitor plate 2. For a rectangular capacitor length:width aspect ratios in the range of 1:4 to 4:1 are preferred. As a further alternative/addition one can adjust the length of the ohmic metal contact 4 around the periphery of the doped semiconductor capacitor plate 2. Increasing the length of the contact 4 reduces the resistive loss of the capacitor 1. As a further alternative/addition one can adjust the separation between the ohmic metal contact 4 and the doped semiconductor capacitor plate 2, preferably by an extension of the tongue 8 as shown in FIG. 5.

The ability to tune the resistance of the capacitor 1 according to the invention provides a novel method of integrating resistance and capacitive elements into a single component for use in integrated circuit design.

In a further embodiment the metal plate of the capacitor acts as a bond pad connected to an electronic circuit elsewhere on the substrate by an electrically conducting path.

The invention claimed is:

1. A capacitor comprising:
   a metal plate;
   a doped semiconductor plate doped with a dopant, the doped semiconductor plate having a top, a bottom and a side having an edge;
   a dielectric sandwiched therebetween; and
   a metallic contact coupled to the edge of the doped semiconductor plate wherein the metallic contact extends around at least a portion of the edge of the semiconductor plate.

2. A capacitor as claimed in claim 1, wherein the metallic contact extends around at least 5% of the periphery of the semiconductor plate.

3. A capacitor as claimed in claim 2, wherein the metallic contact extends completely around the edge of the semiconductor plate.

4. A capacitor as claimed in claim 1, wherein the doped semiconductor plate comprises a tongue which protrudes beyond a periphery of the metal plate for connection to the metallic contact.

5. A capacitor as claimed in claim 1, wherein the semiconductor plate is a III V semiconductor plate.

6. A capacitor as claimed in claim 1, wherein the doped semiconductor plate is $In_xGa_{1-x}As$, wherein X is in the range 0 to 0.7.

7. A capacitor as claimed in claim 1, wherein the dopant comprises Silicon.

8. A capacitor as claimed in claim 7, wherein a concentration of the dopant is greater than $1 \times 1017$ atoms/cm$^3$.

9. A capacitor as claimed in claim 7, wherein a concentration of the dopant is greater than $5 \times 10^{17}$ atoms/cm$^3$.

10. A capacitor as claimed in claim 7, wherein a concentration of the dopant is greater than $1 \times 10^{18}$ atoms/cm$^3$.

11. A capacitor as claimed in claim 7, wherein a concentration of the dopant is greater than $2 \times 10^{18}$ atoms/cm$^3$.

12. A capacitor as claimed in claim 1, wherein the dopant comprises at least one of Boron or Carbon.

13. A capacitor as claimed in claim 12, wherein a concentration of the dopant is greater than $1 \times 10^{17}$ atoms/cm$^3$.

14. A capacitor as claimed in claim 12, wherein a concentration of the dopant is greater than $5 \times 10^{17}$ atoms/cm$^3$.

15. A capacitor as claimed in claim 12, wherein a concentration of the dopant is greater than $1 \times 10^{18}$ atoms/cm$^3$.

16. A capacitor as claimed in claim 12, wherein a concentration of the dopant is greater than $2 \times 10^{18}$ atoms/cm$^3$.

17. A capacitor as claimed in claim 1, wherein the doped semiconductor plate is a portion of larger semiconductor substrate.

18. A capacitor as claimed in claim 17, wherein the doped semiconductor plate is provided by diffusion of the dopant into the semiconductor substrate.

19. A capacitor as claimed in claim 17, wherein the doped semiconductor plate is provided by implantation of the dopant into the semiconductor substrate.

20. A capacitor as claimed in claim 1, wherein the doped semiconductor plate is deposited as a doped layer on a semiconductor substrate.

21. A capacitor as claimed in claim 1, wherein the dielectric comprises Silicon and Nitrogen, the ratio of Silicon and Nitrogen preferably being in the range 0.5 to 2.

22. A capacitor as claimed in claim 21, wherein the dielectric further comprises hydrogen contaminant.

23. A capacitor as claimed in claim 21, wherein the dielectric is deposited on the doped semiconductor plate by vapour deposition.

24. A capacitor as claimed in claim 1, wherein the dielectric comprises silicon and oxygen preferably in the ratio 0.5 to 3.

25. A capacitor as claimed in claim 24, wherein the dielectric further comprises hydrogen contaminant.

26. A capacitor as claimed in claim 1, wherein the dielectric is a polymer.

27. A capacitor as claimed in claim 1, wherein the metal plate is a bond pad.

28. A capacitor as claimed in claim 1, wherein the metallic contact extends around at least 40% of the periphery of the semiconductor plate.

29. A capacitor as claimed in claim 1, wherein the metallic contact extends around at least 80% of the periphery of the semiconductor plate.

30. A capacitor as claimed in claim 1, wherein the doped semiconductor plate is $In_xGa_{1-x}As$, wherein X is in the range 0.1 to 0.6.

31. A capacitor as claimed in claim 1, wherein the doped semiconductor plate is $In_xGa_{1-x}As$, wherein X is in the range 0.3 to 0.6.

32. A capacitor as claimed in claim 1, wherein the doped semiconductor plate is $In_xGa_{1-x}As$, wherein X is in the range 0.4 to 0.5.

33. A capacitor as claimed in claim 1, wherein the dielectric comprises Silicon and Nitrogen, the ratio of Silicon and Nitrogen preferably being in the range 0.65 to 0.85.

* * * * *